United States Patent
Giraud

(10) Patent No.: US 11,085,477 B2
(45) Date of Patent: Aug. 10, 2021

(54) REAR SEALING BRACKET AND CABINET INCLUDING REAR SEALING BRACKET

(71) Applicant: CORNING RESEARCH & DEVELOPMENT CORPORATION, Corning, NY (US)

(72) Inventor: William Julius McPhil Giraud, Azle, TX (US)

(73) Assignee: Corning Research & Development Corporation, Corning, NY (US)

( * ) Notice: Subject to any disclaimer, the term of this patent is extended or adjusted under 35 U.S.C. 154(b) by 0 days.

(21) Appl. No.: 15/930,788

(22) Filed: May 13, 2020

(65) Prior Publication Data

US 2020/0271149 A1 Aug. 27, 2020

Related U.S. Application Data

(63) Continuation of application No. PCT/US2018/062583, filed on Nov. 27, 2018.

(Continued)

(51) Int. Cl.
*F16M 11/00* (2006.01)
*F16B 12/44* (2006.01)

(Continued)

(52) U.S. Cl.
CPC .......... *F16B 12/44* (2013.01); *A47B 47/0033* (2013.01); *H05K 5/0217* (2013.01); *F16B 2012/443* (2013.01)

(58) Field of Classification Search
CPC ............... F16B 12/44; F16B 2012/443; A47B 47/0033; H05K 5/0217

(Continued)

(56) References Cited

U.S. PATENT DOCUMENTS 3,334,175 A 8/1967 Vincent
4,830,698 A * 5/1989 DeCore ..................... B32B 7/02
156/219

(Continued)

FOREIGN PATENT DOCUMENTS

CN 1755149 A 4/2006
DE 102007018850 B4 5/2011

OTHER PUBLICATIONS

European Patent Application No. 18882437.9 Office Action dated Oct. 9, 2020; 9 Pages; European Patent Office.

(Continued)

*Primary Examiner* — Todd M Epps
(74) *Attorney, Agent, or Firm* — Grant A. Gildehaus

(57) ABSTRACT

A bracket for coupling at least three frame members to one another may include a structural portion including at least one relatively rigid first material, and a sealing portion including at least one second material different than the at least one first material. The bracket may also include first, second, and third receivers, each including a retainer portion configured to be coupled to an end of a respective frame member, and a sealing interface configured to provide a substantially dirt-resistant and fluid-resistant seal between a portion of the end of the respective frame member and the respective receiver. The bracket and frame members may form a joint configured to be incorporated into a frame for forming a cabinet.

29 Claims, 8 Drawing Sheets

Related U.S. Application Data

(60) Provisional application No. 62/592,740, filed on Nov. 30, 2017.

(51) Int. Cl.
*A47B 47/00* (2006.01)
*H05K 5/02* (2006.01)

(58) Field of Classification Search
USPC .................. 248/200; 312/111, 265.1, 265.3; 277/593, 608, 639; 403/231
See application file for complete search history.

(56) References Cited

U.S. PATENT DOCUMENTS

| | | | | |
|---|---|---|---|---|
| 5,685,662 | A * | 11/1997 | Rollin | B62D 33/044 403/231 |
| 6,419,239 | B1 * | 7/2002 | Ueda | F16J 15/062 277/639 |
| 7,441,847 | B2 * | 10/2008 | Francisquini | H02B 1/01 312/265.3 |
| 2013/0146321 | A1 | 6/2013 | Takata et al. | |
| 2013/0256251 | A1 | 10/2013 | Oboza et al. | |
| 2015/0111488 | A1 | 4/2015 | Son et al. | |
| 2020/0174212 | A1 * | 6/2020 | Giraud | G02B 6/4452 |

OTHER PUBLICATIONS

International Search Report and Written Opinion of the International Searching Authority; PCT/US2018/062583; dated Feb. 7, 2019; 9 Pages; ISA/US Commissioner for Patents.

* cited by examiner

REAR SEALING BRACKET AND CABINET INCLUDING REAR SEALING BRACKET

RELATED APPLICATIONS

This application is a continuation of International Application No. PCT/US18/62583, filed on Nov. 27, 2018, which claims the benefit of priority to U.S. Application No. 62/592,740, filed Nov. 30, 2017, both applications being incorporated herein by reference.

BACKGROUND

This disclosure relates to cabinets, and more particularly, to cabinets for housing equipment and including brackets for providing structural support and dirt- and/or fluid-resistance between the brackets, the frame members, and/or the panels of the cabinet.

Cabinets may be used to enclose and protect equipment, such as, for example, fiber optic equipment associated with fiber optic cables including optical fibers. For example, fiber optic equipment may be enclosed in cabinets and provide connections and circuitry for facilitating broadband voice, video, and data transmission. One example of a cabinet for enclosing fiber optic equipment is a fiber optic distribution outdoor cabinet, some of which may be intended to be installed in an outdoor environment exposed to the elements. In order to substantially prevent moisture and dust from the environment from entering the interior of the cabinet, some cabinets include a seamless, single-piece shell. However, cabinets formed in such a manner may exhibit a number of possible drawbacks. For example, due at least in part to the single-piece shell construction, such cabinets are not scalable, and thus, cannot be easily assembled or modified in the field to increase (or reduce) the size of the cabinet to tailor the cabinet to meet the capacity requirements of the equipment being enclosed therein. Thus, it may be necessary to manufacture such cabinets in a large number of different sizes to meet the needs for different installations, which may result in manufacturing and inventory inefficiencies. In addition, larger cabinets needed to meet large capacity requirements may be cumbersome to transport and install due to their large size and weight. Further, it may be difficult to repair or replace damaged portions of the cabinet due, at least in part, to having a single-piece construction and/or the possible need to disconnect any cables entering the cabinet when repairing the cabinet, which may result in additional complexity and expense.

Some examples described herein may address one or more of these possible drawbacks.

SUMMARY

The present disclosure is generally directed to a bracket for coupling three or more frame members to one another. The bracket may include a structural portion including at least one first material, and a sealing portion including at least one second material different than the at least one first material. The at least one first material may be relatively more rigid than the at least one second material. In some examples, the at least one second material may be relatively more elastic than the at least one first material. The bracket may also include a first receiver defining a first longitudinal axis and configured to receive an end of a first frame member. In some examples, the first receiver may include a first retainer portion configured to be coupled to the end of the first frame member, and a first sealing interface configured to provide a substantially dirt-resistant and fluid-resistant seal between a portion of the end of the first frame member and the first receiver. The bracket may also include a second receiver defining a second longitudinal axis substantially parallel to the first longitudinal axis of the first receiver and configured to receive an end of a second frame member. In some examples, the second receiver may include a second retainer portion configured to be coupled to the end of the second frame member, and a second sealing interface configured to provide a substantially dirt-resistant and fluid-resistant seal between a portion of the end of the second frame member and the second receiver. The bracket may also include a third receiver defining a third longitudinal axis substantially perpendicular to at least one of the first longitudinal axis of the first receiver or the second longitudinal axis of the second receiver, and configured to receive an end of a third frame member. In some examples, the third receiver may include a third retainer portion configured to be coupled to the end of the third frame member, and a third sealing interface configured to provide a substantially dirt-resistant and fluid-resistant seal between a portion of the end of the third frame member and the third receiver. The structural portion may include the first retainer portion, the second retainer portion, and the third retainer portion, and the sealing portion may include the first sealing interface, the second sealing interface, and the third sealing interface.

This disclosure is also generally directed to a joint at which three or more frame members are coupled to one another. The joint may include a first frame member defining a first longitudinal frame member axis, a second frame member defining a second longitudinal frame member axis, and a third frame member defining a third longitudinal frame member axis substantially perpendicular to at least one of the first longitudinal frame member axis or the second longitudinal frame member axis. The joint may also include a bracket coupling the first frame member, the second frame member, and the third frame member to one another. The bracket may include a structural portion including at least one first material, and a sealing portion including at least one second material different than the at least one first material. The bracket may include a first receiver defining a first longitudinal axis and receiving an end of the first frame member. In some examples, the first receiver may include a first retainer portion coupled to the end of the first frame member, and a first sealing interface configured to provide a substantially dirt-resistant and fluid-resistant seal between a portion of the end of the first frame member and the first receiver. The bracket may also include a second receiver defining a second longitudinal axis substantially parallel to the first longitudinal axis of the first receiver and configured to receive an end of the second frame member. The second receiver may include a second retainer portion coupled to the end of the second frame member, and a second sealing interface configured to provide a substantially dirt-resistant and fluid-resistant seal between a portion of the end of the second frame member and the second receiver. The bracket may also include a third receiver defining a third longitudinal axis substantially perpendicular to at least one of the first longitudinal axis of the first receiver or the second longitudinal axis of the second receiver, and configured to receive an end of the third frame member. The third receiver may include a third retainer portion coupled to the end of the third frame member, and a third sealing interface configured to provide a substantially dirt-resistant and fluid-resistant seal between a portion of the end of the third frame member and the third receiver. The first frame member longitudinal axis and the second frame member longitudinal axis may be substantially parallel with respect to one another.

This disclosure is also generally directed to a frame for a cabinet. The frame may include a plurality of frame members, and a plurality of brackets coupling at least some of the plurality of frame members to one another. At least one of the plurality of brackets may include a structural portion including at least one first material, and a sealing portion including at least one second material different than the at least one first material. The bracket may also include a first receiver defining a first longitudinal axis and receiving an end of a first one of the plurality of frame members. In some examples, the first receiver may include a first retainer portion coupled to the end of the first one of the plurality of frame members, and a first sealing interface configured to provide a substantially dirt-resistant and fluid-resistant seal between a portion of the end of the first one of the plurality of frame members and the first receiver. The bracket may also include a second receiver defining a second longitudinal axis substantially parallel to the first longitudinal axis of the first receiver and configured to receive an end of a second one of the plurality of frame members. The second receiver may include a second retainer portion coupled to the end of the second one of the plurality of frame members, and a second sealing interface configured to provide a substantially dirt-resistant and fluid-resistant seal between a portion of the end of the second one of the plurality of frame members and the second receiver. The bracket may also include a third receiver defining a third longitudinal axis substantially perpendicular to at least one of the first longitudinal axis of the first receiver or the second longitudinal axis of the second receiver, and configured to receive an end of a third one of the plurality of frame members. In some examples, the third receiver may include a third retainer portion coupled to the end of the third one of the plurality of frame members, and a third sealing interface configured to provide a substantially dirt-resistant and fluid-resistant seal between a portion of the end of the third one of the plurality of frame members and the third receiver. The first one of the plurality of frame members defines a first frame member longitudinal axis, the second one of the plurality of frame members defines a second frame member longitudinal axis, and the third one of the plurality of frame members defines a third frame member longitudinal axis. In some examples, the first frame member longitudinal axis and the second frame member longitudinal axis are substantially parallel with respect to one another, and the third frame member longitudinal axis is substantially perpendicular with respect to the first frame member longitudinal axis and the second frame member longitudinal axis.

This disclosure is also generally directed to a cabinet defining an interior and an exterior. The cabinet may include a frame and a plurality of panels coupled to the frame to define the interior and the exterior of the cabinet. The frame may include a plurality of frame members and a plurality of brackets coupling at least some of the plurality of frame members to one another. At least one of the plurality of brackets may include a structural portion including at least one first material, and a sealing portion including at least one second material different than the at least one first material. The at least one bracket may also include a first receiver defining a first longitudinal axis and receiving an end of a first one of the plurality of frame members. In some examples, the first receiver may include a first retainer portion coupled to the end of the first one of the plurality of frame members, and a first sealing interface configured to provide a substantially dirt-resistant and fluid-resistant seal between a portion of the end of the first one of the plurality of frame members and the first receiver. The at least one bracket may also include a second receiver defining a second longitudinal axis substantially parallel to the first longitudinal axis of the first receiver and configured to receive an end of a second one of the plurality of frame members. In some examples, the second receiver may include a second retainer portion coupled to the end of the second one of the plurality of frame members, and a second sealing interface configured to provide a substantially dirt-resistant and fluid-resistant seal between a portion of the end of the second one of the plurality of frame members and the second receiver. The at least one bracket may also include a third receiver defining a third longitudinal axis substantially perpendicular to at least one of the first longitudinal axis of the first receiver or the second longitudinal axis of the second receiver, and configured to receive an end of a third frame member. In some examples, the third receiver may include a third retainer portion configured to be coupled to the end of the third frame member, and a third sealing interface configured to provide a substantially dirt-resistant and fluid-resistant seal between a portion of the end of the third frame member and the third receiver. The first one of the plurality of frame members may define a first frame member longitudinal axis, the second one of the plurality of frame members may define a second frame member longitudinal axis, and the first frame member longitudinal axis and the second frame member longitudinal axis are substantially parallel with respect to one another.

DETAILED DESCRIPTION

Figure 1:
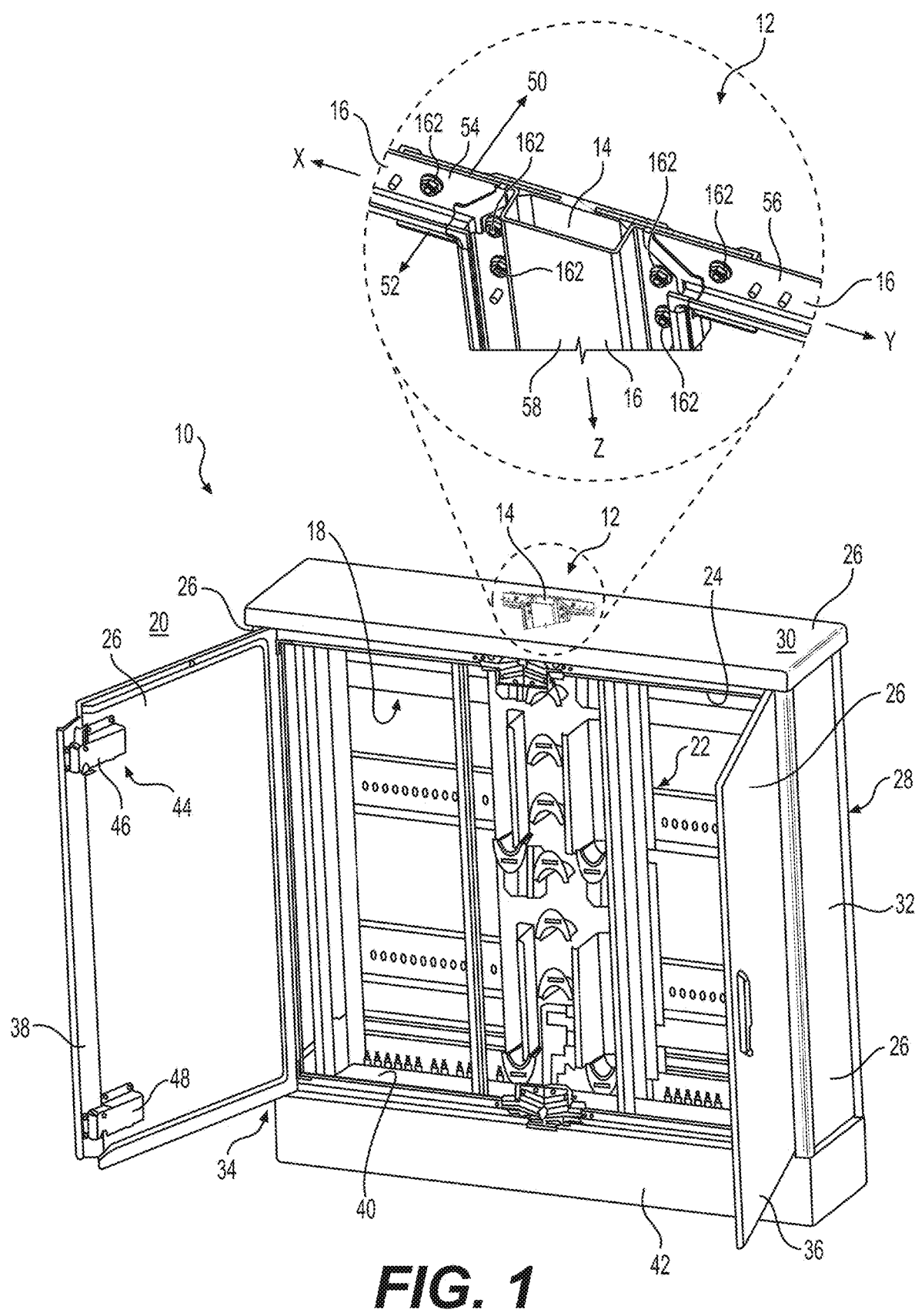
FIG. 1 is a schematic perspective view of an example cabinet including a detailed perspective view of an example joint including an example bracket coupling three example frame members to one another.

Reference will now be made in detail to embodiments, examples of which are illustrated in the accompanying drawings. Whenever possible, the same reference numbers are used throughout the drawings to refer to the same or like parts.

This disclosure is generally directed to cabinets, such as, for example, cabinets for housing equipment and including brackets for providing structural support and dirt-resistance and fluid-resistance between the brackets and frame members of the cabinet, and/or between the brackets and the exterior panels of the cabinet. According to some examples, the cabinets described herein may be assembled on site and may be scalable to meet the capacity requirements of the equipment being enclosed by the cabinet. For example, some examples of the cabinet may be formed by a frame assembled from frame members coupled to one another by brackets. The frame members may be provided (or modified on-site) to build a frame (e.g., off-site or on-site) defining the desired interior dimensions, and the brackets may be used to couple the frame members to one another. Thereafter, panels may be attached to the frame to create the cabinet. In some examples, one or more of the panels may be pivotally coupled to the frame to provide one or more doors configured to pivot between open and closed orientations.

In some examples, the equipment to be enclosed in the cabinet may be assembled and/or coupled to the interior of the cabinet during and/or after completion of assembly of the cabinet. In some examples, the brackets may provide both structural support for securely coupling two or more (e.g., three or more) frame members to one another (e.g., rigidly coupling them to one another) and a substantially dirt- and fluid-resistant seal (e.g., a fluid-tight seal) between the bracket and the two or more frame members and, in some examples, between the bracket and panels of the cabinet. Some examples may also at least partially provide a cabinet that is scalable to tailor its exterior size and/or interior size to meet the capacity needs of a particular installation due to the cabinet being formed as a frame with panels secured thereto, as compared to a cabinet including a monolithic shell having a size that cannot be easily altered. For example, brackets such as at least some of the example brackets disclosed herein may be used with frame members having different lengths (or different combinations of frame members and brackets) to create cabinets having different dimensions to meet the capacity needs of a particular installation. In addition, some examples may provide an ability to repair and/or replace portions of a cabinet, for example, by removing one or more of the panels from the frame and repairing and/or replacing the portions of the cabinet desired to be replaced and/or repaired. In addition, if the future requirements of a particular installation change, such that, for example, a larger interior space is desired to meet greater interior capacity requirements, some examples may provide the ability to be modified to increase the size of the cabinet, for example, by removing some of the exterior panels, increasing the size of the frame to the desired size using frame members and brackets, and installing panels onto the modified frame to create a cabinet having the desired interior capacity.

FIG. 1 is a schematic perspective view of an example cabinet 10 including a detailed perspective view of an example joint 12 including an example bracket 14 coupling three example frame members 16 to one another. The example cabinet 10 shown in FIG. 1 is a cabinet for enclosing fiber optic equipment, such as fiber optic cables including optical fibers, and connections and circuitry for facilitating broadband voice, video, and data transmission. In some examples, the cabinet 10 may be a fiber optic distribution outdoor cabinet, which may be intended to be installed in an outdoor environment exposed to the elements. Other types of cabinets for enclosing other types of equipment are contemplated.

As shown in FIG. 1, the example cabinet 10 defines an interior 18 and an exterior 20. In the example shown, the interior 18 includes various structures 22 known to those skilled in the art for facilitating routing and/or connection of fiber optic cables including optical fibers (not shown for clarity). The example cabinet 10 shown includes a frame 24 and a plurality of exterior panels 26 secured to the frame 24 for enclosing the interior 18 of the cabinet 10. For example, the cabinet 10 includes a back panel 28 coupled to a back side of the frame 24, a top panel 30 coupled to a top side of the frame 24, a first side panel 32 coupled to a first side of the frame 24, a second side panel 34 coupled to a second side of the frame 24 opposite the first side panel 32, a first door panel 36 coupled to a front side of the frame 24, such that it pivots with respect to the frame 24, and a second door panel 38 coupled to a front side of the frame 24, such that it pivots with respect to the frame 24. In some examples, the cabinet 10 also includes a bottom panel 40 coupled to a lower side of the frame 24. In some examples, the bottom panel 40 may include apertures (not shown for clarity) facilitating entry of cables, such as, for example, fiber optic cables, into the interior 18 of the cabinet 10. The example shown also includes a skirt 42 coupled to and extending around the periphery of the bottom of the frame 24, which provides protection for cables entering the interior 18 of the cabinet 10 through the bottom panel 40.

As shown in FIG. 1, one or more of the first door panel 36 or the second door panel 38 may include a latch assembly 44 for securing the first and second door panels 36 and 38 in the closed orientation. In the example shown, the latch assembly 44 includes an upper latch mechanism 46 and a lower latch mechanism 48, each including a keeper (not shown) configured to selectively engage a respective upper member of the frame 24 and lower member of the frame 24. Although FIG. 1 shows the latch assembly 44 coupled to an interior side of the second door panel 38, in some examples, a second latch mechanism may, alternatively or additionally, be coupled to the interior side of the first door panel 36.

As shown in FIG. 1, the frame 24 includes frame members 16 coupled to one another via brackets, such as, for example, the example bracket 14 shown. The example bracket 14 defines an interior side 50 and an exterior side 52 and is configured to couple a first frame member 54 (e.g., a first cross member) having a first longitudinal axis X, a second frame member 56 (e.g., also a cross member) having a second longitudinal axis Y, and a third frame member 58 (e.g., an upright) having a third longitudinal axis Z, to one another, for example, such that the longitudinal axes X and Y are substantially parallel with respect to one another, and the third longitudinal axis Z is substantially perpendicular with respect to the first longitudinal axis X and the second longitudinal axis Y.

Figure 2:
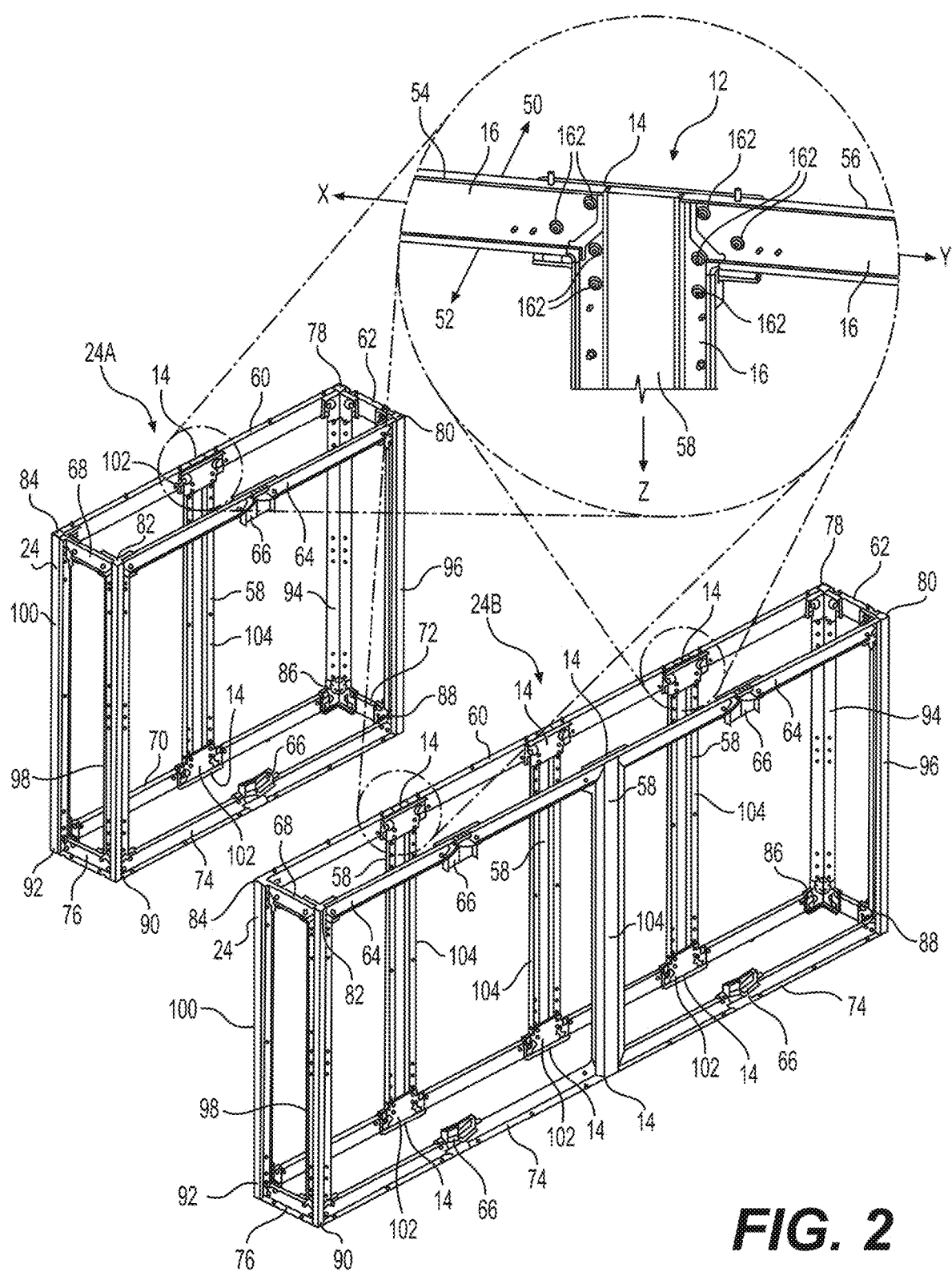
FIG. 2 is a schematic perspective view of two example frames for example cabinets including a detailed perspective partial view of an example joint.

FIG. 2 is a schematic perspective view of two example frames 24A and 24B for respective cabinets including a detailed perspective partial view of an example joint 12. As shown in FIG. 2, the example frame 24A may include an upper back frame member 60 including, for example, a first frame member 54 and a second frame member 56 coupled to one another by the bracket 14, an upper first side frame member 62, an upper front frame member 64 including, for example, a first frame member 54 and a second frame member 56 coupled to one another by a bracket 66, an upper second side frame member 68 opposite the upper first side frame member 62, a lower back frame member 70 including, for example, a first frame member 54 and a second frame member 56 coupled to one another by another bracket 14, a lower first side frame member 72, a lower front frame member 74 including, for example, a first frame member 54 and a second frame member 56 coupled to one another by another bracket 66, and a lower second side frame member 76 opposite the lower first side frame member 72. The example frame 24A also includes a first upper corner bracket 78 coupling the upper back frame member 60 and the upper first side frame member 62 to one another, a second upper corner bracket 80 coupling the upper first side frame member 62 and the upper front frame member 64 to one another, a third upper corner bracket 82 coupling the upper front frame member 64 and the upper second side frame member 68 to one another, and a fourth upper corner bracket 84 coupling the upper second side frame member 68 and the upper back frame member 60 to one another. The example frame 24A further includes a first lower corner bracket 86 coupling the lower back frame member 70 and the lower first side frame 72 member to one another, a second lower corner bracket 88 coupling the lower first side frame member 72 and the lower front frame member 74 to one another, a third lower corner bracket 90 coupling the lower front frame member 74 and the lower second side frame member 76 to one another, and a fourth lower corner bracket 92 coupling the lower second side frame member 76 and the lower back frame member 70 to one another.

In the example shown in FIG. 2, the frame 24A also includes a first corner frame member 94 (e.g., an upright) coupling the first upper corner bracket 78 and the first lower corner bracket 86 to one another, a second corner frame member 96 (e.g., an upright) coupling the second upper corner bracket 80 and the second lower corner bracket 88 to one another, a third corner frame member 98 (e.g., an upright) coupling the third upper corner bracket 82 and third lower corner bracket 90 to one another, and a fourth corner frame member 100 (e.g., an upright) coupling the fourth upper corner bracket 84 and the fourth lower corner bracket 92 to one another.

In some examples, the brackets 14 and the brackets 66 may serve to increase the length of the frame 24, provide coupling points 102 for additional frame members, such as a frame member 104 (e.g., a third frame member 58), and/or provide structural support and/or dirt- and fluid-resistant sealing structures (e.g., fluid-tight sealing structures) for one or more of the back panel 28 and/or the first door panel 36 and the second door panel 38, respectively. Use of brackets such as the brackets 14 and brackets 66 may facilitate expanding the length of the frame 24. In some examples, although not shown, brackets similar to the brackets 14 may be used to facilitate increasing the height and/or width of the frame 24 by incorporating such brackets into the corner frame members and/or side frame members, respectively. Such brackets may facilitate increasing the size of the cabinet, (e.g., on-site) without replacing the entire cabinet.

For example, as shown in FIG. 2, the example frame 24B has been lengthened relative to the example frame 24A described above. For example, the length of the frame 24B has been doubled relative to the length of the example frame 24A by using additional pairs of brackets at least similar to the example brackets 14 and brackets 66 to effectively connect two of the example frames 24A to one another in an end-to-end fashion. In addition, the example frame 24B also includes additional frame members 104 (e.g., uprights) to provide additional support for the cabinet in which the frame 24B is incorporated. In this example manner, the brackets 14, the brackets 66, the corner brackets, and the frame members 16 may be used to create frames 24 of different dimensions, for example, in the length, height, and/or width dimensions.

Figure 3:
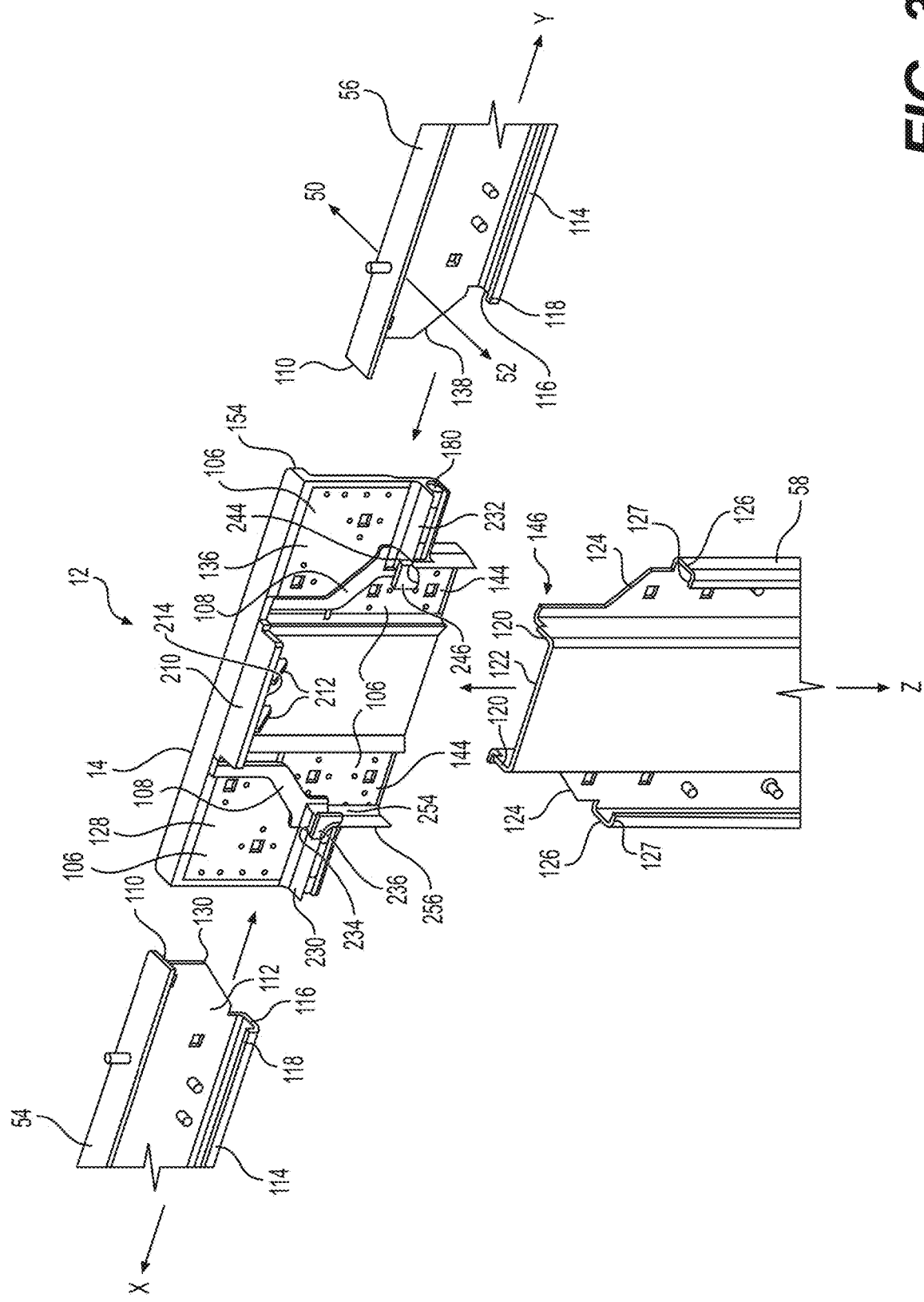
FIG. 3 is a schematic perspective exploded view of an example joint including an example bracket configured to couple at least three example frame members to one another.

FIG. 3 is a schematic perspective exploded view of an example joint 12 including an example bracket 14 coupling three example frame member 16 to one another to form the joint 12. In the example shown in FIG. 3, the bracket 14 may include a structural portion 106 including at least one first material, and a sealing portion 108 including at least one second material different than the at least one first material. In some examples, the at least one first material is relatively more rigid than the at least one second material, and, in some examples, the at least one second material is relatively more elastic than the at least one first material. For example, the at least one first material may be sufficiently rigid to rigidly secure the frame members 16 to one another, such that the frame 24 provides a structural support to which the panels 26 of the cabinet 10 (see FIG. 1) may be secured. In some examples, it may be desirable for the frame 24 to be sufficiently rigid to support the weight of the cabinet 10 and the equipment enclosed therein, and/or to prevent flexing of the frame 24 sufficient to compromise a substantially dirt- and fluid-resistant seal (e.g., a fluid-tight seal) between the frame 24 and the panels 26 coupled to the frame 24. In some examples, the at least one first material may include one or more of steel, stainless steel, aluminum, titanium, fiber reinforced plastic, carbon fiber, or any other suitable strong and rigid material(s). In some examples, the at least one second material may be sufficiently elastic to provide a substantially dirt- and fluid-resistant seal (e.g., a fluid-tight seal) between the brackets 14 and the frame members 16. In some examples, the at least one second material may include one or more of natural and/or synthetic rubbers and plastics. In some examples, the structural portion 106 is formed as a single unitary piece. In some examples, the sealing portion 108 may be molded over at least a portion of the structural portion 106.

As shown in FIG. 3, the frame members 16 include a first frame member 54 and a second frame member 56 defining respective longitudinal axes X and Y that are substantially parallel with respect to one another when coupled to the example bracket 14, and a third frame member 58 defining a longitudinal axis Z that is substantially perpendicular with respect to the longitudinal axes X and Y. In the example shown, the first frame member 54 and the second frame member 56 have substantially the same cross-section (e.g., the same size and/or shape taken perpendicular with respect to the respective longitudinal axes X and Y). For example, each of the first and second frame members 54 and 56 includes an upper flange 110 (e.g., a substantially planar flange) configured to extend toward the exterior side 52 of the bracket 14 when coupled to the bracket 14. Each of the first and second frame members 54 and 56 also includes a web 112 (e.g., a substantially planar web) configured to extend transverse to (e.g., substantially orthogonal to) the upper flange 110, and a lower channel 114 configured to extend away from the exterior side 52 of the bracket 14 when coupled to the bracket 14, for example, in a direction substantially parallel to the upper flange 110. In the example shown, the lower channel 114 includes a trough 116 (e.g., a substantially planar trough) extending from the web 112 and terminating with a lip 118 that extends transverse to the trough 116 (e.g., substantially perpendicular to the trough 116). In the example shown, the web 112, the trough 116, and the lip 118 form a channel configured to provide a fluid passage between the web 112 and the lip 118. Other frame member configurations are contemplated.

In some examples, the third frame member 58 forms a modified C-shaped channel defined by opposing side rails 120 spaced from one another by a web 122 extending between the opposing side rails 120. In the example shown in FIG. 3, the third frame member 58 also includes a pair of opposing flats 124, each extending outwardly substantially parallel to the web 122 from a respective distal end of one of the opposing side rails 120. In addition, the example third frame member 58 also includes a pair of opposing return flanges 126, each extending substantially parallel to the opposing side rails 120 from a respective distal end of one of the opposing flats 124. In some examples, the remote ends of one or more of the return flanges 126 may include an additional flange 127 substantially parallel with respect to the web 122 (e.g., substantially aligned with the web 122), for example, as shown in FIG. 3. Other frame member configurations are contemplated.

Although the bracket 14, the first frame member 54, the second frame 56, the third frame member 58, and related structures are sometimes described herein including terminology related to upper, lower, and lateral relationships, which may imply absolute relative orientations and/or relationships, these descriptions should not be interpreted in a manner to necessarily require absolute relationships, but rather, they should be interpreted in manner consistent with relative orientations and relationships.

Figure 4:
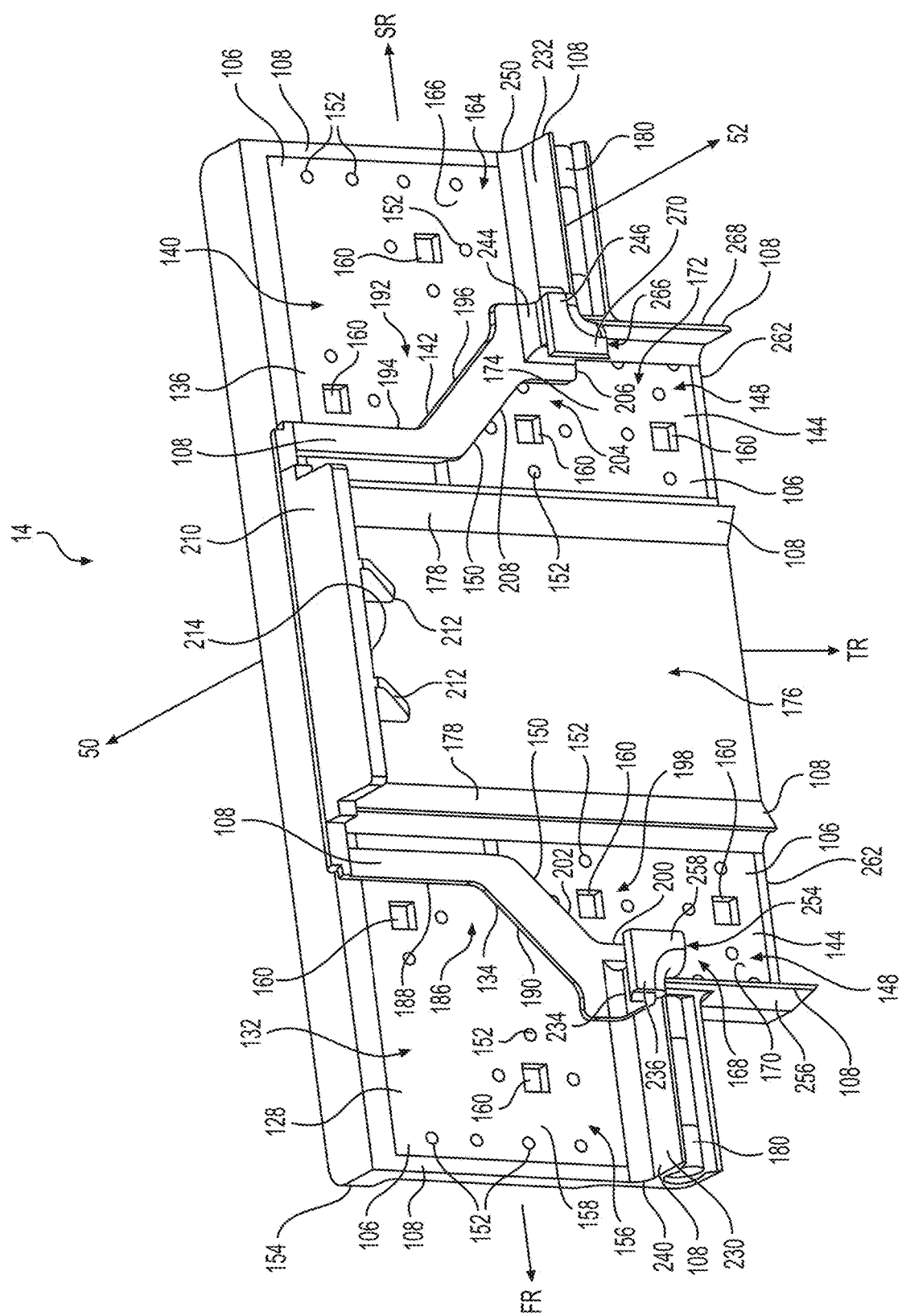
FIG. 4 is schematic perspective view of an example bracket shown from an exterior side.

As shown in FIG. 4, the example bracket 14 includes a first receiver 128 defining a first longitudinal axis FR and receiving an end 130 of the first frame member 54. In some examples, the first receiver 128 may include a first retainer portion 132 coupled to the end 130 of the first frame member 54 (see FIG. 3), and a first sealing interface 134 configured to provide a substantially dirt- and fluid-resistant seal (e.g., a fluid-tight seal) between a portion of the end 130 of the first frame member 54 and the first receiver 128. The example bracket 14 also includes a second receiver 136 defining a second longitudinal axis SR substantially parallel to the first longitudinal axis FR of the first receiver 128 and configured to receive an end 138 of the second frame member 56 (see FIG. 3). In some examples, the second receiver 136 may include a second retainer portion 140 coupled to the end 138 of the second frame member 56, and a second sealing interface 142 configured to provide a substantially dirt- and fluid-resistant seal (e.g., a fluid-tight seal) between a portion of the end 138 of the second frame member 56 and the second receiver 136. In addition, the example bracket 14 also includes a third receiver 144 defining a third longitudinal axis TR substantially perpendicular to the first longitudinal axis FR of the first receiver 140 and the second longitudinal axis SR of the second receiver 136, and configured to receive an end 146 of the third frame member 58 (see FIG. 3). In some examples, the third receiver 144 may include a third retainer portion 148 coupled to the end 146 of the third frame member 58, and a third sealing interface 150 configured to provide a substantially dirt- and fluid-resistant seal (e.g., a fluid-tight seal) between a portion of the end 146 of the third frame member 58 and the third receiver 144.

As shown in FIG. 4, the structural portion 106 may include one or more of the first retainer portion 132, the second retainer portion 140, or the third retainer portion 148. In some examples, the sealing portion 108 may include one or more of the first sealing interface 134, the second sealing interface 142, or the third sealing interface 150. In some examples, the sealing portion 108 may at least partially encase the structural portion 106. For example, the sealing portion 108 may be over-molded onto the structural portion 106. In some examples, such as the example shown in FIG. 4, the structural portion 106 may include a plurality of apertures 152 (see also FIGS. 3 and 8) in which a portion of the at least one second material may be received, providing engagement (e.g., additional engagement) between the structural portion 106 and the sealing portion 108. In some examples, the cross-sectional size and/or shape of one or more of the apertures 152 may be substantially constant as the aperture 152 extends from one side of the structural portion 106 to the other side of the structural portion 106. In some examples, the cross-sectional size and/or shape of one or more of the apertures 152 may change as the aperture 152 extends from one side of the structural portion 106 to the other side of the structural portion 106.

In the example shown in FIG. 4, the bracket 14 also includes an inwardly extending flange 154 extending transverse with respect to the first receiver 128, the second receiver 136, and the third receiver 144. In some examples, the structural portion 106 and the sealing portion 108 may include the inwardly extending flange 154. In some examples, either the structural portion 106 or the sealing portion 108 may include the inwardly extending flange 154.

As shown in FIGS. 3 and 4, the first retainer portion 132 may include a first attachment portion 156 presenting an abutment surface 158 facing a direction transverse to the first longitudinal axis FR of the first receiver 128. In some examples, the first retainer portion 132 may include one or more holes 160 (see, e.g., FIGS. 4 and 8) extending through the first attachment portion 156 configured to receive fasteners 162 (e.g., screws and/or bolts) (see FIGS. 1, 2, and 6) configured to secure the end 130 of the first frame member 54 to the first retainer portion 132. In some examples, the second retainer portion 140 may include a second attachment portion 164 presenting a second abutment surface 166 facing a direction transverse to the second longitudinal axis SR of the second receiver 136. In some examples, the second retainer portion 140 may include one or more holes 160 extending through the second attachment portion 164 configured to receive fasteners 162 (e.g., screws and/or bolts) configured to secure the end 138 of the second frame member 56 to the second retainer portion 140. In some examples, the third retainer portion 148 may include a third attachment portion 168 presenting a third abutment surface 170 facing a direction transverse to the third longitudinal axis TR of the third receiver 144. In some examples, the third retainer portion 148 may include one or more holes 160 extending through the third attachment portion 168 configured to receive fasteners 162 (e.g., screws and/or bolts) configured to secure the end 146 of the third frame member 58 to the third retainer portion 148. In the example shown, the third retainer portion 148 also includes a fourth attachment portion 172 presenting an additional third abutment surface 174 facing a direction transverse to the third longitudinal axis TR of the third receiver 144. In some examples, the third retainer portion 148 may include one or more holes 160 extending through the fourth attachment portion 172 configured to receive fasteners 162 (e.g., screws and/or bolts) configured to secure the end 146 of the third frame member 58 to the third retainer portion 148. The third attachment portion 168 and the fourth attachment portion 172 are located opposite one another relative to a central longitudinal region 176, which, in the example shown, is bordered by a pair of longitudinal guides 178.

In some examples, one or more of the holes 160 may have a square-shaped cross-section configured to engage with a complimentary portion of a carriage bolt (not shown). In some examples, devices and/or methods other than fasteners may be used to couple the one or more of the first frame member 54, the second frame member 56, or the third frame member 58 to the bracket 14. In some examples, by attaching the frame members (e.g., directly) to the structural portion 106, the frame members may be rigidly coupled to one another, with the structural portion 106 substantially maintaining the relative angles and/or relative positions between the frame members.

As shown in FIG. 4, some brackets 14 may include one or more levels 180 coupled to the bracket 14. For example, the example bracket 14 shown in FIG. 4 includes two levels 180 (e.g., bubble levels) coupled to the first receiver 128 and the second receiver 136, such that the levels 180 may be used to level the bracket 14 (e.g., and the frame 24 attached thereto).

Figure 5:
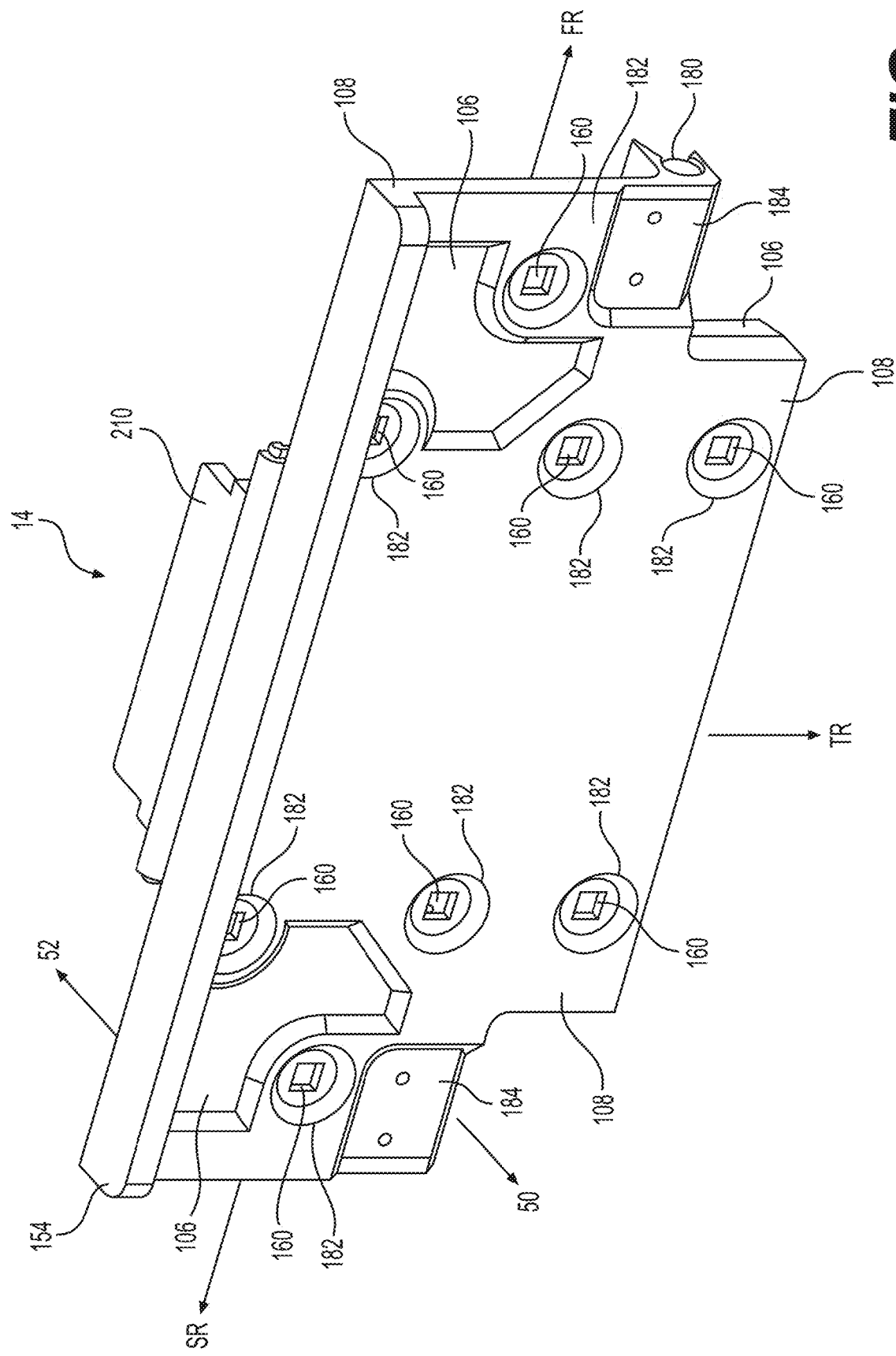
FIG. 5 is a schematic perspective view of the example bracket shown in FIG. 4 shown from an interior side.

As shown in FIGS. 4 and 5, the example bracket 14 defines an interior side 50 and an exterior side 52, and the holes 160 may be surrounded on the interior side 50 by portions 182 of the sealing portion 108. Some such examples may result in providing a substantially dirt- and fluid-resistant seal (e.g., a substantially fluid-tight seal) between the interior side 50 and the exterior side 52 of the bracket 14, even though the holes 160 for receiving fasteners pass from the interior side 50 to the exterior side 52 of the bracket 14.

As shown in FIG. 5, some examples of the bracket 14 may be configured such that the sealing portion 108 defines exposed surfaces 184 of the structural portion 106 on the interior side 50 devoid of the at least one second material of the sealing portion 108. The exposed surfaces 184 may provide a rigid surface against which another portion of the cabinet 10 may abut.

Figure 7:
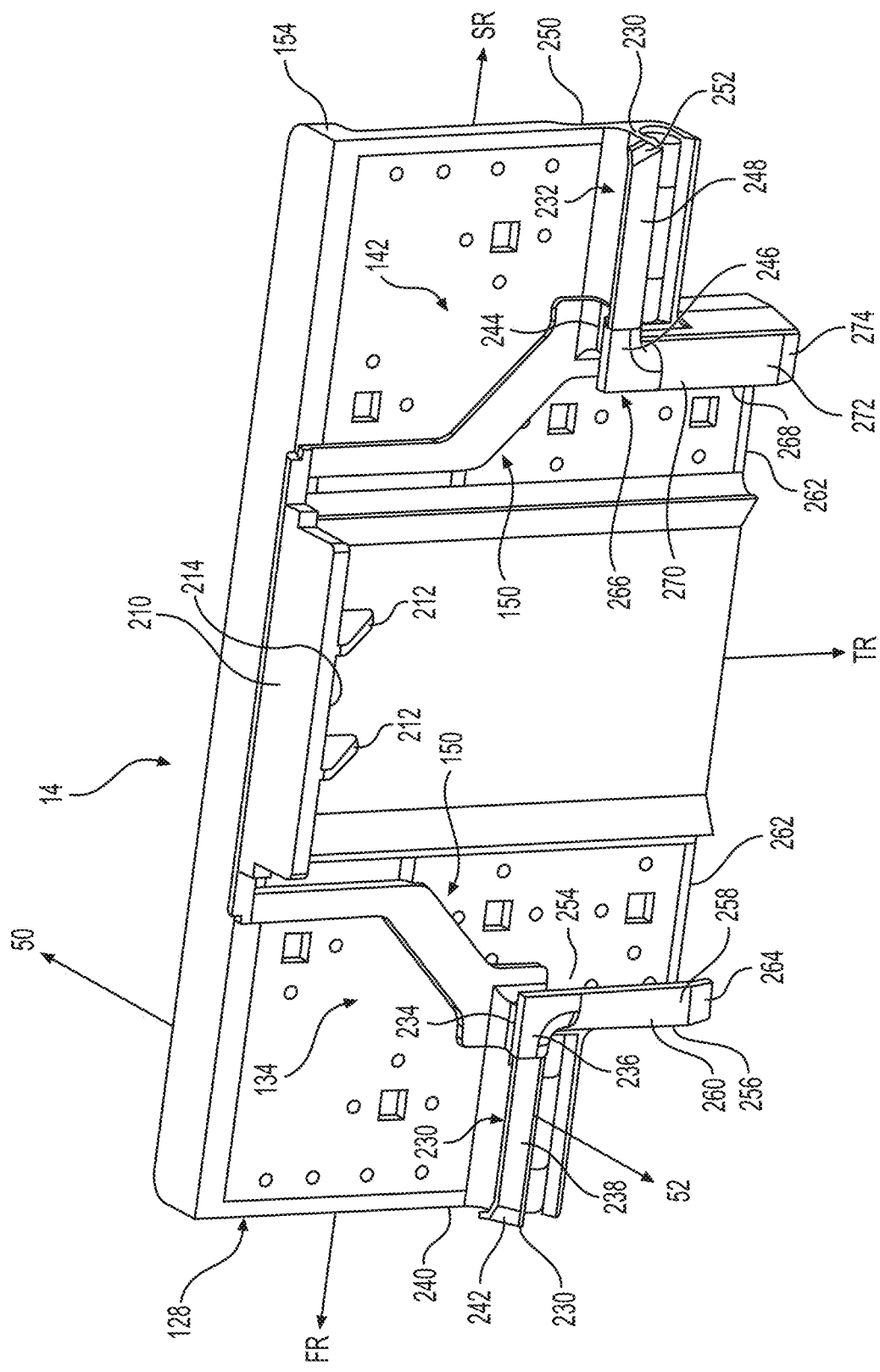
FIG. 7 is a schematic perspective view of another example bracket for coupling at least three frame members to one another.

Referring to FIGS. 4 and 7, in some examples, the first sealing interface 134 may include a seal stop 186 including a first seal stop portion 188 extending in a first direction transverse (e.g., orthogonal) to the first longitudinal axis FR of the first receiver 128. In some examples, the first sealing interface 134 may also include a second seal stop portion 190 extending in a second direction oblique with respect to the first direction. The first seal stop portion 188 and the second seal stop portion 190 present respective seal surfaces for providing a substantially dirt- and fluid-resistant seal (e.g., a fluid-tight seal) between the first seal stop portion 188 and a first portion of the end 130 of the first frame member 54, and between the second seal stop portion 190 and a second portion of the end 130 of the first frame member 54.

In some examples of the bracket 14, the second sealing interface 142 may include a second seal stop 192 including a third seal stop portion 194 extending in a third direction transverse (e.g., orthogonal) to the second longitudinal axis SR of the second receiver 136. In some examples, the second sealing interface 142 may also include a fourth seal stop portion 196 extending in a fourth direction oblique with respect to the third direction. The third seal stop portion 194 and the fourth seal stop portion 196 present respective seal surfaces for providing a substantially dirt- and fluid-resistant seal (e.g., a fluid-tight seal) between the third seal stop portion 194 and a first portion of the end 138 of the second frame member 56, and between the fourth seal stop portion 196 and a second portion of the end 138 of the second frame member 56.

In some examples of the bracket 14, the third sealing interface 150 may include a third seal stop 198 including a fifth seal stop portion 200 extending in a fourth direction transverse (e.g., orthogonal) to the third longitudinal axis SR of the third receiver 144. In some examples, the third sealing interface 150 may also include a sixth seal stop portion 202 extending in a fifth direction oblique with respect to the fourth direction. The fifth seal stop portion 200 and the sixth seal stop portion 202 present respective seal surfaces for providing a substantially dirt- and fluid-resistant seal (e.g., a fluid-tight seal) between the fifth seal stop portion 200 and a first portion of the end 146 of the third frame member 58, and between the sixth seal stop portion 202 and a second portion of the end 146 of the third frame member 58. In some examples, for example as shown in FIG. 4, the third sealing interface 150 may include a fourth seal stop 204 including a seventh seal stop portion 206 extending in the fourth direction, and an eighth seal stop portion 208 extending in the fifth direction. In some examples, the third seal stop 198 and the fourth seal stop 204 may be mirror images of each other, for example, with respect to the central longitudinal region 176.

The example bracket 14 also includes an end cap 210 extending substantially perpendicular to the structural portion 106 and in a direction opposite the inwardly extending flange 154. In some examples, for example as shown, the end cap 210 is supported by one or more buttresses 212 extending between the lower surface 214 (see, e.g., FIG. 4) of the end cap 210 and the central longitudinal region 176 of the bracket 14. The end cap 210 may serve to close- and seal-off an end of the third frame member 58, for example, by closing the open end defined by the rails 120 and web 122 of the third fame member 58. In some examples, the one more buttresses 212 may assist with maintaining the desired position and orientation of the end cap 210 relative to the central longitudinal region 176 of the bracket 14, for example, to maintain a seal provided by the end cap 210 against the end of the third frame member 58.

Figure 6:
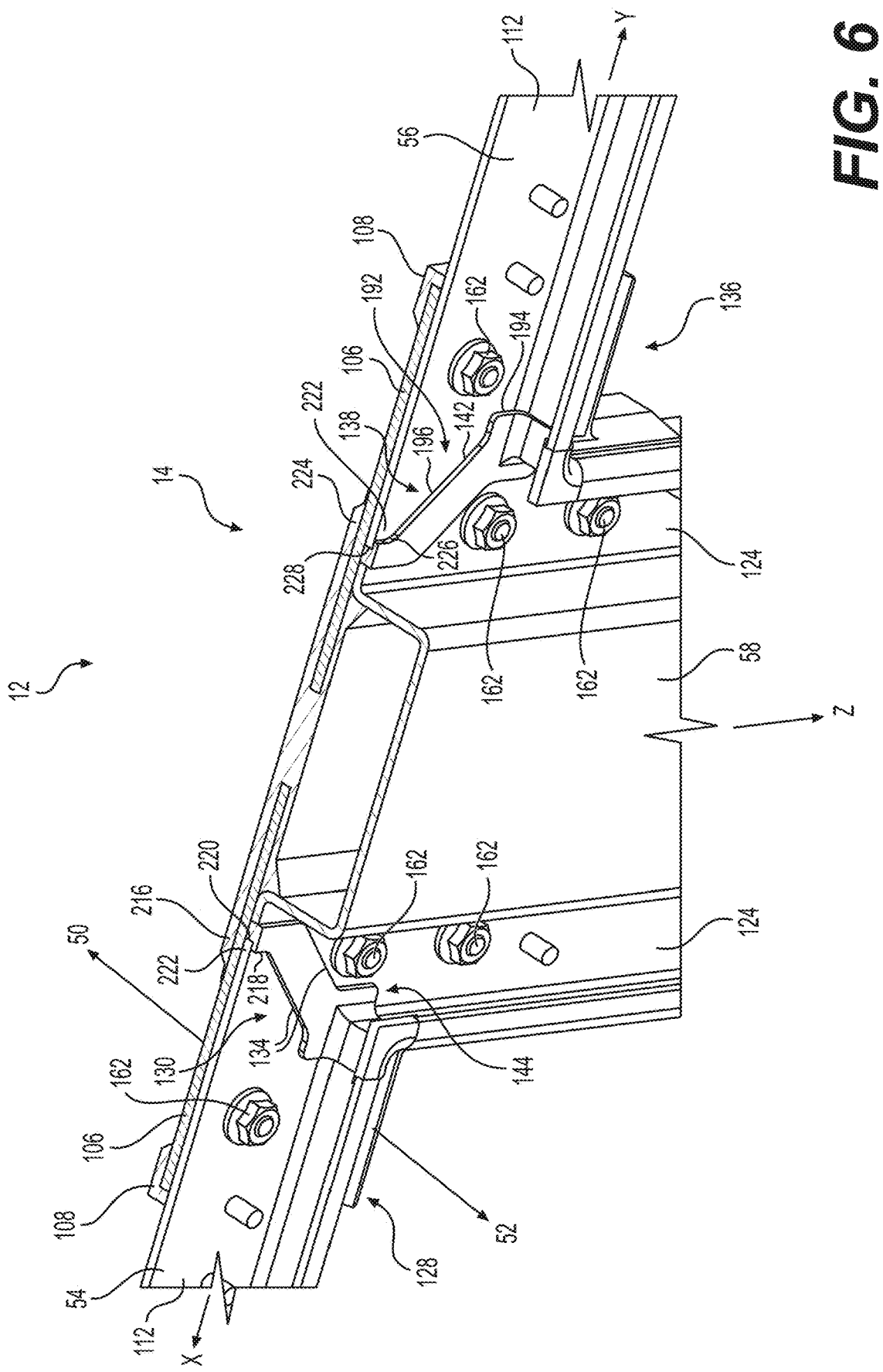
FIG. 6 is a schematic partial section perspective view of an example bracket coupling three example frame members to one another.

In some examples, for example, as shown in FIG. 6, the first sealing interface 134 may include opposing fluid barriers 216 and 218 extending in a direction substantially parallel to the first longitudinal axis FR of the first receiver 128 and defining a pocket 220 configured to receive therein an edge portion 222 of the end 130 of the first frame member 54. In some examples, the pocket 220 and related structure may provide a relatively more reliable dirt- and fluid-resistant seal between the bracket 14 and the first frame member 54. In some examples of the bracket 14, the second sealing interface 142 may include second opposing fluid barriers 224 and 226 extending in a direction substantially parallel to the second longitudinal axis SR of the second receiver 136 and forming a second pocket 228 at least similar to the opposing fluid barriers 216 and 218 and pocket 220 formed in the first sealing interface 134. The pocket 228 may be configured to receive therein an edge portion of the end 138 of the second frame member 56. In some examples, the third sealing interface 150 may include opposing fluid barriers extending in a direction substantially parallel to the third longitudinal axis TR of the third receiver 144 and forming a pocket at least similar to the opposing fluid barriers 216 and 218 and pocket 220 formed in the first sealing interface 134. In addition, the third sealing interface 150 may also include additional opposing fluid barriers extending in a direction substantially parallel to the third longitudinal axis TR on the opposite side of the central longitudinal region 176 of the third receiver 144, and forming a pocket at least similar to the opposing fluid barriers and pocket formed in the first sealing interface 134. The pocket(s) of the third sealing interface 150 may be configured to receive therein an edge portion of the end 146 of the third frame member 58.

As shown in FIGS. 4 and 7, the first sealing interface 134 may include a first seal flange 230 extending in a first direction substantially parallel to the first longitudinal axis FR of the first receiver 128. In some examples, the first seal flange 230 may be configured to be biased against a surface of the first frame member 54. For example, the first seal flange 230 may be configured to be biased against the trough 116 and/or the lip 118 of the first frame member 54, which may provide a relatively more reliable dirt- and fluid-resistant seal between the bracket 14 and the first frame member 54. In some examples of the bracket 14, the second sealing interface 142 may include a second seal flange 232 at least similar to the first seal flange 230 formed in the first sealing interface 134.

As shown in FIGS. 4 and 7, some examples of the bracket 14 may include a first sealing interface 134 that also includes a first channel 234 extending substantially parallel relative to the first longitudinal axis FR of the first receiver 128 to the first seal flange 230. The first channel 234 may include a first outer edge 236 configured to press against an interior surface of a panel 26 (e.g., a back panel 28, see FIG. 1), either directly or indirectly via an intermediately located gasket. In some examples, for example, the example shown in FIG. 7, the first channel 234 may include an extension 238 extending the length of the first channel 234 substantially to an edge 240 of the bracket 14. In some such examples, the first outer edge 236 of the extension 238 may have a tapered cross-sectional shape extending away from the first channel 234 toward the interior surface of the panel 26 (e.g., similar to an edge of a windshield wiper) and configured improve the sealing ability of the first outer edge 236. In the example shown in FIG. 7, a distal end of the first outer edge 236 includes a chamfer 242 to enhance the seal provided by the first channel 234. Similarly, the second sealing interface 142 includes a second channel 244 extending substantially parallel relative to the second longitudinal axis SR of the second receiver 136 to the second seal flange 232. The second channel 244 may include a second outer edge 246 configured to press against an interior surface of a panel 26 (e.g., a back panel 28, see FIG. 1). In the example shown in FIG. 7, the second channel 244 may include a second extension 248 extending the length of the second channel 244 substantially to an edge 250 of the bracket 14. In some such examples, the second outer edge 246 of the second extension 248 may have a tapered cross-sectional shape extending away from the second channel 244 toward the interior surface of the panel 26 and configured improve the sealing ability of the second outer edge 246. In the example shown in FIG. 7, a distal end of the second outer edge 246 includes a second chamfer 252 to enhance the seal provided by the second channel 244.

As shown in FIGS. 4, 6, and 7, the third sealing interface 150 includes a third channel 254 extending substantially parallel relative to the third longitudinal axis TR of the third receiver 144 to a third seal flange 256. The third channel 254 may include a third outer edge 258 configured to press against an interior surface of a panel 26 (e.g., a back panel 28, see FIG. 1). In the example shown in FIG. 7, the third channel 254 may include a third extension 260 extending the length of the third channel 254 substantially to an edge 262 of the bracket 14. In some such examples, the third outer edge 258 of the third extension 260 may have a tapered cross-sectional shape extending away from the third channel 254 toward the interior surface of the panel 26 and configured improve the sealing ability of the third outer edge 258. In the example shown in FIG. 7, a distal end of the third outer edge 258 includes a third chamfer 264 to enhance the seal provided by the third channel 254.

The example third sealing interface 150 shown also includes a fourth channel 266 extending substantially parallel relative to the third longitudinal axis TR of the third receiver 144 to a fourth seal flange 268. The fourth channel 266 may include a fourth outer edge 270 configured to press against an interior surface of a panel 26. In the example shown in FIG. 7, the fourth channel 266 may include a fourth extension 272 extending the length of the fourth channel 266 substantially to the edge 262 of the bracket 14. In some such examples, the fourth outer edge 270 of the fourth extension 272 may have a tapered cross-sectional shape extending away from the fourth channel 266 toward the interior surface of the panel 26 and configured improve the sealing ability of the fourth outer edge 270. In the example shown in FIG. 7, a distal end of the fourth outer edge 270 includes a fourth chamfer 274 to enhance the seal provided by the fourth channel 266.

Figure 8:
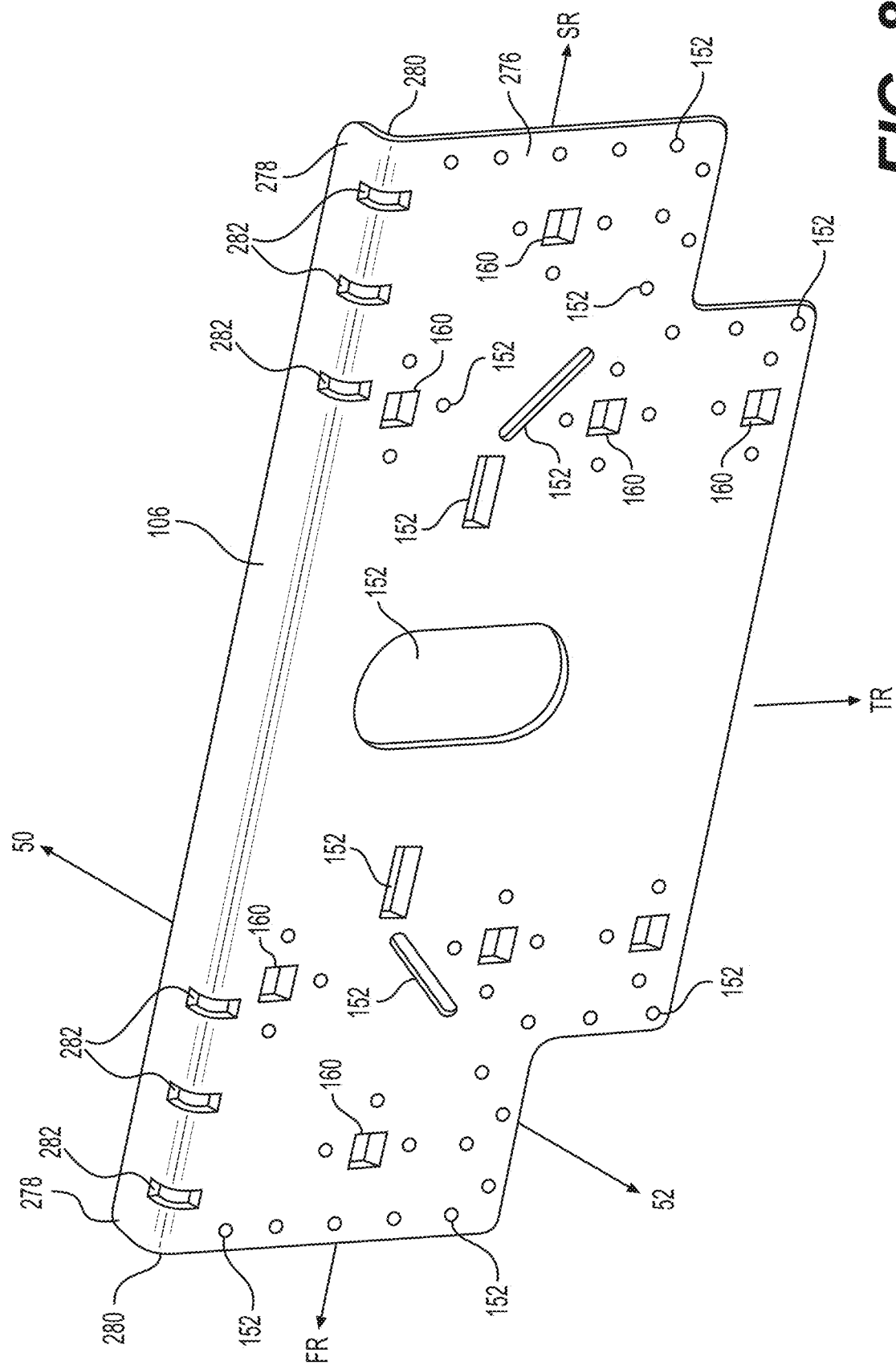
FIG. 8 is a schematic perspective view of an example structural portion of an example bracket for coupling at least three frame members to one another.

FIG. 8 is a schematic perspective view of an example structural portion 106 of an example bracket 14. In some examples, the structural portion 106 may be formed as a single unitary piece, for example, as shown in FIG. 8. The example structural portion 106 shown in FIG. 8 includes a substantially planar portion 276 and a flange 278 formed by a bend 280, such that the flange 278 is substantially perpendicular to the substantially planar portion 276. In some examples, the structural portion 106 may include one or more holes 282 located at the bend 280. A portion of the at least one second material may be received in the one or more holes 282, which may provide engagement (e.g., additional engagement) between the structural portion 106 and the sealing portion 108. In some examples, the cross-sectional size and/or shape of one or more of the holes 282 may be substantially constant as the hole 282 extends from one side of the structural portion 106 to the other side of the structural portion 106. In some examples, the cross-sectional size and/or shape of one or more of the holes 282 may change as the hole 282 extends from one side of the structural portion 106 to the other side of the structural portion 106. Although shown as rectangular in FIG. 8, one or more of the holes 282 may have other shapes. In some examples, the flange 278 may correspond to the inwardly extending flange 154 of the bracket 14 (see, e.g., FIG. 5) and may provide structural support for the inwardly extending flange 154, which, in some examples, may include a portion of the sealing portion 108 of the bracket 14, which may be formed (e.g., molded) over the flange 278 of the structural portion 106.

As explained previously herein, the structural portion 106 may be formed from at least one first material, and in some examples, the at least one first material may be relatively more rigid than the at least one second material forming the sealing portion 108, which may be, in some examples, relatively more elastic than the at least one first material. For example, the at least one first material may be sufficiently rigid to rigidly secure the frame members 16 to one another, such that the frame 24 provides a structural support to which the panels 26 of the cabinet 10 (see FIG. 1) may be secured. In some examples, it may be desirable for the frame 24 to be sufficiently rigid to support the weight of the cabinet 10 and the equipment enclosed therein, and/or to prevent flexing of the frame 24 sufficient to compromise a substantially dirt- and fluid-resistant seal (e.g., a fluid-tight seal) between the frame 24 and the panels 26 coupled to the frame 24. In some examples, the at least one first material may include one or more of steel, stainless steel, aluminum, titanium, fiber reinforced plastic, carbon fiber, or any other suitable strong and rigid material(s). In some examples, the at least one second material may be sufficiently elastic to provide a substantially dirt- and fluid-resistant seal (e.g., a fluid-tight seal) between the brackets 14 and the frame members 16 and/or between the brackets 14 and the panels 26. In some examples, the at least one second material may include one or more of natural and/or synthetic rubbers and plastics.

Although this subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A bracket for coupling three or more frame members to one another, the bracket comprising:
a structural portion comprising at least one first material;
a sealing portion comprising at least one second material different than the at least one first material;
wherein the at least one first material is relatively more rigid than the at least one second material;
a first receiver defining a first longitudinal axis and configured to receive an end of a first frame member, the first receiver comprising:
a first retainer portion configured to be coupled to the end of the first frame member; and
a first sealing interface configured to provide a substantially dirt- and fluid-resistant seal between a portion of the end of the first frame member and the first receiver;
a second receiver defining a second longitudinal axis substantially parallel to the first longitudinal axis of the first receiver and configured to receive an end of a second frame member, the second receiver comprising:
a second retainer portion configured to be coupled to the end of the second frame member; and
a second sealing interface configured to provide a substantially dirt- and fluid-resistant seal between a portion of the end of the second frame member and the second receiver; and
a third receiver defining a third longitudinal axis substantially perpendicular to at least one of the first longitudinal axis of the first receiver or the second longitudinal axis of the second receiver, and configured to receive an end of a third frame member, the third receiver comprising:
a third retainer portion configured to be coupled to the end of the third frame member; and
a third sealing interface configured to provide a substantially dirt- and fluid-resistant seal between a portion of the end of the third frame member and the third receiver,
wherein the structural portion comprises the first retainer portion, the second retainer portion, and the third retainer portion, and
wherein the sealing portion comprises the first sealing interface, the second sealing interface, and the third sealing interface.

2. The bracket of claim 1, wherein the sealing portion at least partially encases the structural portion.

3. The bracket of claim 1, wherein the sealing portion is formed onto the structural portion.

4. The bracket of claim 1, wherein the structural portion comprises a plurality of apertures in which a portion of the at least one second material is received, providing engagement between the structural portion and the sealing portion.

5. The bracket of claim 1, wherein the first retainer portion comprises:
a first attachment portion presenting an abutment surface facing a direction transverse to the first longitudinal axis of the first receiver; and
one or more holes extending through the first attachment portion configured to receive one or more fasteners configured to secure the end of the of the first frame member to the first retainer portion.

6. The bracket of claim 5, wherein the second retainer portion comprises:
a second attachment portion presenting a second abutment surface facing a direction transverse to the second longitudinal axis of the second receiver; and
one or more holes extending through the second attachment portion configured to receive one or more fasteners configured to secure the end of the second frame member to the second retainer portion.

7. The bracket of claim 6, wherein the third retainer portion comprises:
a third attachment portion presenting an abutment surface facing a direction transverse to the third longitudinal axis of the third receiver; and
one or more holes extending through the third attachment portion configured to receive one or more fasteners configured to secure the end of the of the third frame member to the third retainer portion.

8. The bracket of claim 1, wherein the first sealing interface comprises a seal stop comprising:
a first seal stop portion extending in a first direction transverse to the first longitudinal axis of the first receiver; and
a second seal stop portion extending in a second direction oblique with respect to the first direction,
wherein the first seal stop portion and the second seal stop portion present respective seal surfaces for providing a substantially dirt- and fluid-resistant seal between the first seal stop portion and a first portion of the end of the first frame member and between the second seal stop portion and a second portion of the end of the first frame member.

9. The bracket of claim 8, wherein the second sealing interface comprises a second seal stop comprising:
a third seal stop portion extending in a third direction transverse to the second longitudinal axis of the second receiver; and
a fourth seal stop portion extending in a fourth direction oblique with respect to the third direction,
wherein the third seal stop portion and the fourth seal stop portion present respective seal surfaces for providing a substantially dirt- and fluid-resistant seal between the third seal stop portion and a first portion of the end of the second frame member and between the fourth seal stop portion and a second portion of the end of the second frame member.

10. The bracket of claim 9, wherein the third sealing interface comprises a third seal stop comprising:
a fifth seal stop portion extending in a fifth direction transverse to the third longitudinal axis of the third receiver; and
a sixth seal stop portion extending in a sixth direction oblique with respect to the fifth direction,
wherein the fifth seal stop portion and the sixth seal stop portion present respective seal surfaces for providing a substantially dirt- and fluid-resistant seal between the fifth seal stop portion and a first portion of the end of the third frame member and between the sixth seal stop portion and a second portion of the end of the third frame member.

11. The bracket of claim 1, wherein the first sealing interface comprises opposing fluid barriers extending in a direction substantially parallel to the first longitudinal axis of the first receiver and defining a pocket configured to receive therein an edge portion of the end of the first frame member.

12. The bracket of claim 11, wherein the second sealing interface comprises second opposing fluid barriers extending in a direction substantially parallel to the second longitudinal axis of the second receiver and defining a second pocket configured to receive therein an edge portion of the end of the second frame member.

13. The bracket of claim 12, wherein the third sealing interface comprises third opposing fluid barriers extending in a direction substantially parallel to the third longitudinal axis of the third receiver and defining a third pocket configured to receive therein an edge portion of the end of the third frame member.

14. The bracket of claim 1, wherein the first sealing interface comprises a first seal flange extending in a first direction substantially parallel to the first longitudinal axis of the first receiver, the first seal flange configured to be biased against a surface of the first frame member.

15. The bracket of claim 14, wherein the first sealing interface further comprises a first seal extension extending from the first seal flange in the direction substantially parallel to the first direction and substantially transverse to the first seal flange, thereby defining a partial sleeve configured to receive therein a portion of the end of the first frame member.

16. The bracket of claim 15, wherein the third sealing interface comprises a third seal flange extending in a third direction substantially parallel to the third longitudinal axis of the third receiver, the third seal flange configured to be biased against a surface of the third frame member.

17. The bracket of claim 16, wherein the third sealing interface further comprises a third seal extension extending from the third seal flange in the direction substantially parallel to the third direction and substantially transverse to the third seal flange, thereby defining a third partial sleeve configured to receive therein a portion of the end of the third frame member.

18. The bracket of claim 14, wherein the second sealing interface comprises a second seal flange extending in a second direction substantially parallel to the second longitudinal axis of the second receiver, the second seal flange configured to be biased against a surface of the second frame member.

19. The bracket of claim 18, wherein the second sealing interface further comprises a second seal extension extending from the second seal flange in the direction substantially parallel to the second direction and substantially transverse to the second seal flange, thereby defining a second partial sleeve configured to receive therein a portion of the end of the second frame member.

20. The bracket of claim 14, wherein the first sealing interface further comprises a first channel extending parallel to the first longitudinal axis of the first receiver, the first channel comprising an outer edge configured to press against an interior surface of a panel.

21. The bracket of claim 20, wherein the second sealing interface further comprises a second channel extending parallel to the second longitudinal axis of the second receiver, the second channel comprising a second outer edge configured to press against an interior surface of a panel.

22. The bracket of claim 20, wherein the third sealing interface further comprises a third channel extending parallel to the third longitudinal axis of the third receiver, the third channel comprising a third outer edge configured to press against an interior surface of a panel.

23. The bracket of claim 1, wherein the bracket defines an interior side and an exterior side, and the bracket further comprises an inwardly extending flange extending toward the interior side.

24. The bracket of claim 23, wherein the structural portion and the sealing portion comprise the inwardly extending flange.

25. The bracket of claim 1, further comprising one or more levels coupled to one or more of the first receiver, the second receiver, or the third receiver.

26. The bracket of claim 1, wherein the first retainer portion comprises:
a first attachment portion presenting a first abutment surface facing a direction transverse to the first longitudinal axis of the first receiver; and
one or more holes extending through the first attachment portion configured to receive one or more fasteners configured to secure the end of the first frame member to the first retainer portion,
wherein the bracket defines an interior side and an exterior side, and
wherein the one or more holes are surrounded on the interior side by portions of the sealing portion.

27. The bracket of claim 26, wherein the second retainer portion comprises:
a second attachment portion presenting a second abutment surface facing a direction transverse to the second longitudinal axis of the second receiver; and
one or more second holes extending through the second attachment portion configured to receive one or more fasteners configured to secure the end of the second frame member to the second retainer portion,
wherein the one or more second holes are surrounded on the interior side by portions of the sealing portion.

28. The bracket of claim 27, wherein the third retainer portion comprises:
a third attachment portion presenting a third abutment surface facing a direction transverse to the third longitudinal axis of the third receiver; and
one or more third holes extending through the third attachment portion configured to receive one or more fasteners configured to secure the end of the third frame member to the third retainer portion,
wherein the one or more third holes are surrounded on the interior side by portions of the sealing portion.

29. A frame for a cabinet, the frame comprising:
a plurality of frame members; and
a plurality of brackets coupling at least some of the plurality of frame members to one another, at least one of the plurality of brackets comprising:
a structural portion comprising at least one first material;
a sealing portion comprising at least one second material different than the at least one first material;
a first receiver defining a first longitudinal axis and receiving an end of a first one of the plurality of frame members, the first receiver comprising:
a first retainer portion associated with the end of the first one of the plurality of frame members; and
a first sealing interface configured to provide a substantially dirt- and fluid-resistant seal between a portion of the end of the first one of the plurality of frame members and the first receiver;
a second receiver defining a second longitudinal axis substantially parallel to the first longitudinal axis of the first receiver and configured to receive an end of a second one of the plurality of frame members, the second receiver comprising:
  a second retainer portion associated with the end of the second one of the plurality of frame members; and
  a second sealing interface configured to provide a substantially dirt- and fluid-resistant seal between a portion of the end of the second one of the plurality of frame members and the second receiver; and
a third receiver defining a third longitudinal axis substantially perpendicular to at least one of the first longitudinal axis of the first receiver or the second longitudinal axis of the second receiver, and configured to receive an end of a third one of the plurality of frame members, the third receiver comprising:
  a third retainer portion associated with the end of the third one of the plurality of frame members; and
  a third sealing interface configured to provide a substantially dirt- and fluid-resistant seal between a portion of the end of the third one of the plurality of frame members and the third receiver, wherein the first one of the plurality of frame members defines a first frame member longitudinal axis, the second one of the plurality of frame members defines a second frame member longitudinal axis, and the third one of the plurality of frame members defines a third frame member longitudinal axis, and wherein the first frame member longitudinal axis and the second frame member longitudinal axis are substantially parallel with respect to one another, and the third frame member longitudinal axis is substantially perpendicular with respect to the first frame member longitudinal axis and the second frame member longitudinal axis.

* * * * *

UNITED STATES PATENT AND TRADEMARK OFFICE
CERTIFICATE OF CORRECTION

PATENT NO. : 11,085,477 B2
APPLICATION NO. : 15/930788
DATED : August 10, 2021
INVENTOR(S) : William Julius McPhil Giraud It is certified that error appears in the above-identified patent and that said Letters Patent is hereby corrected as shown below:

In the Claims

In Column 15, Line 66, Claim 5, delete "of the of the" and insert -- of the --, therefor.

In Column 16, Line 18, Claim 7, delete "of the of the" and insert -- of the --, therefor.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*